US008722548B2

(12) United States Patent  (10) Patent No.: US 8,722,548 B2
Aoyama et al.  (45) Date of Patent: May 13, 2014

(54) STRUCTURES AND TECHNIQUES FOR ATOMIC LAYER DEPOSITION

(75) Inventors: Shintaro Aoyama, Kohfu (JP); Robert D. Clark, Schnectady, NY (US); Steven P. Consiglio, Albany, NY (US); Marinus Hopstaken, Carmel, NY (US); Hemanth Jagannathan, Guilderland, NY (US); Paul Charles Jamison, Hopewell Junction, NY (US); Gert Leusink, Salt Point, NY (US); Barry Paul Linder, Hastings-on-Hudson, NY (US); Vijay Narayanan, New York, NY (US); Cory Wajda, Sand Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 810 days.

(21) Appl. No.: 12/890,051

(22) Filed: Sep. 24, 2010

(65) Prior Publication Data

US 2012/0074533 A1   Mar. 29, 2012

(51) Int. Cl.
   *H01L 21/469*  (2006.01)
(52) U.S. Cl.
   USPC ................................ 438/785; 257/E21.274
(58) Field of Classification Search
   USPC .................... 438/785, 287; 257/E21.274
   See application file for complete search history.

(56) References Cited

U.S. PATENT DOCUMENTS

| 7,067,439 | B2 | 6/2006 | Metzner et al. | 438/785 |
| 7,442,415 | B2 * | 10/2008 | Conley et al. | 427/255.36 |
| 7,547,952 | B2 | 6/2009 | Metzner et al. | 257/411 |
| 7,569,500 | B2 | 8/2009 | Metzner et al. | 438/785 |
| 7,679,148 | B2 * | 3/2010 | Watanabe et al. | 257/E29.132 |
| 8,313,994 | B2 * | 11/2012 | Clark | 438/778 |
| 8,367,560 | B2 * | 2/2013 | Ogawa et al. | 438/785 |
| 2007/0045752 | A1 * | 3/2007 | Forbes et al. | 257/387 |
| 2008/0274617 | A1 | 11/2008 | Milligan | 438/685 |

OTHER PUBLICATIONS

Conley, Jr. et al. "Interval Annealing During Alternating Pulse Deposition", Mat. Res. Soc. Symp. Proc., vol. 811, © 2004, pp. D1.3.1-D1.3.6.*

Ahn et al., "Influence of active layer thickness and annealing in zinc oxide TFT grown by atomic layer deposition," Surface and Interface Analysis, Special Issue: ECASIA '09, vol. 42, Issue 6-7, pp. 955-958, Jun.-Jul. 2010 (Abstract, 1 pp.; article first published online Apr. 13, 2010).

(Continued)

*Primary Examiner* — Stephen W Smoot
*Assistant Examiner* — Sun M Kim
(74) *Attorney, Agent, or Firm* — Harrington & Smith

(57) ABSTRACT

In one exemplary embodiment, a method includes: forming at least one first monolayer of first material on a surface of a substrate by performing a first plurality of cycles of atomic layer deposition; thereafter, annealing the formed at least one first monolayer of first material under a first inert atmosphere at a first temperature between about 650° C. and about 900° C.; thereafter, forming at least one second monolayer of second material by performing a second plurality of cycles of atomic layer deposition, where the formed at least one second monolayer of second material at least partially overlies the annealed at least one first monolayer of first material; and thereafter, annealing the formed at least one second monolayer of second material under a second inert atmosphere at a second temperature between about 650° C. and about 900° C.

15 Claims, 9 Drawing Sheets

(56) References Cited

OTHER PUBLICATIONS

Conley-Jr., et al., "Interval Annealing During Alternating Pulse Deposition," in Integration of Advanced Micro- and Nanoelectronic Devices- Critical Issues and Solutions, edited by Morais, et al. (Mater. Res. Soc. Symp. Proc. 811, Warrendale, PA, 2004), D1.3 (Abstract, 3pp).

Conley-Jr., et al., "Alternating Pulse Deposition of High-k Metal Oxide Thin Films using Hf(NO3)4 as a Metal and an Oxygen Source with Multiple in-situ Annealing," Abs. 550, 204th Meeting, The Electrochemical Society, Inc., 2003 (1 pp.).

Nabatame, et al., "Design and Proof of High Quality HfAlOx Film Formation for MOSCAPs and nMOSFETs through Layer-by-Layer Deposition and Annealing Process," Symposium on VLSI Technology Digest of Technical Papers, 2003 (2 pp.).

Tapily, et al., "Frank van der Merwe Growth of ALD ZnO Studied by X-ray Diffraction," 218th Electrochemical Society Meeting, MA2010-02, Las Vegas, NV, Oct. 10-15, 2010 (1 pp.; accessed Aug. 23, 2010).

Tu et al., "Reliability Characteristics of D2O-Radical Annealed ALD HfO2 Dielectric," 217th Electrochemical Society Meeting, Dielectrics for Nanosystems 4: Materials Science, Processing, Reliability, and Manufacturing, edited by Misra et al. (ECS Trans., vol. 28, Issue 2, pp. 331-338, Vancouver, Canada, Apr. 25-30, 2010; 1 pp.).

Ishikawa, et al., "Extended Scalability of HfON/SiON Gate Stack Down to 0.57 nm Equivalent Oxide Thickness with High Carrier Mobility by Post-Deposition Annealing," Japanese Journal of Applied Physics 48 (2009; 5 pp., published online Apr. 20, 2009).

Ogawa, et al., "0.6tun-EOT high-k gate stacks with HfSiOx interfacial layer grown by solid-phase reaction between HfO2 and Si substrate," Microelectronic Engineering 84 (2007) 1861-1864 (4 pp.).

Yeo, et al., "Improvement of Electrical Properties of MOCVD HfO2 by Multistep Deposition," Electrochemical and Solid-State Letters, 6 (11) F42-F44 (2003; 3 pp.).

\* cited by examiner

STRUCTURES AND TECHNIQUES FOR ATOMIC LAYER DEPOSITION

TECHNICAL FIELD

The exemplary embodiments of this invention relate generally to semiconductor structures and, more specifically, relate to the formation of semiconductor structures via atomic layer deposition.

BACKGROUND

This section endeavors to supply a context or background for the various exemplary embodiments of the invention as recited in the claims. The content herein may comprise subject matter that could be utilized, but not necessarily matter that has been previously utilized, described or considered. Unless indicated otherwise, the content described herein is not considered prior art, and should not be considered as admitted prior art by inclusion in this section.

Chemical vapor deposition (CVD) is a chemical process designed to produce high-performance solid materials used in semiconductor processing. Typically, CVD techniques expose a substrate to one or more volatile precursors that decompose and/or react on the surface of the substrate to produce the deposited material. By-products may be produced and, subsequently, removed via gas flow through the reaction chamber. As non-limiting examples, CVD may be used to deposit layers of polysilicon, $SiO_2$, $Si_3N_4$, SiNH, $HfO_2$, Mo, Ta, Ti, TiN and W.

Atomic layer deposition (ALD) is another thin film deposition technique. ALD uses precursors (chemicals) that react with the surface separately in a sequential manner. A thin film is deposited by repeatedly exposing the precursors to the substrate. While similar in chemistry to CVD, ALD breaks the CVD reaction into two or more half-reactions, maintaining the precursors separately during the overall ALD process. ALD enables atomic scale deposition control and can achieve growth on the order of one monolayer or less per cycle. Separation of the precursors may be obtained by utilizing a purge gas (e.g., N, Ar) after each precursor to remove excess precursor from the process chamber and reduce or prevent parasitic CVD processes (e.g., extra deposition on the substrate via CVD). As non-limiting examples, ALD may be used to deposit layers of $Al_2O_3$, $TiO_2$, $SnO_2$, ZnO, $HfO_2$, TiN, TaN, WN, NbN, Ru, Ir, Pt and ZnS.

BRIEF SUMMARY

In one exemplary embodiment of the invention, a method comprising: forming at least one first monolayer of first material on a surface of a substrate by performing a first plurality of cycles of atomic layer deposition; thereafter, annealing the formed at least one first monolayer of first material under a first inert atmosphere at a first temperature between about 650° C. and about 900° C.; thereafter, forming at least one second monolayer of second material by performing a second plurality of cycles of atomic layer deposition, where the formed at least one second monolayer of second material at least partially overlies the annealed at least one first monolayer of first material; and thereafter, annealing the formed at least one second monolayer of second material under a second inert atmosphere at a second temperature between about 650° C. and about 900° C.

In another exemplary embodiment of the invention, depositing a first plurality of cycles of first material on a surface of a substrate via atomic layer deposition; thereafter, annealing the deposited first plurality of cycles of first material under a first inert atmosphere at a first temperature between about 650° C. and about 900° C.; thereafter, depositing a second plurality of cycles of second material via atomic layer deposition, where the deposited second plurality of cycles of second material at least partially overlie the annealed first plurality of cycles of first material; and thereafter, annealing the deposited second plurality of cycles of second material under a second inert atmosphere at a second temperature between about 650° C. and about 900° C.

In a further exemplary embodiment of the invention, performing a first atomic layer deposition to form at least one first monolayer of first material on a surface of a substrate; thereafter, annealing the formed at least one first monolayer of first material under a first inert atmosphere at a first temperature between about 650° C. and about 900° C.; thereafter, performing a second atomic layer deposition to form at least one second monolayer of second material, where the formed at least one second monolayer of second material at least partially overlies the annealed at least one first monolayer of first material; and thereafter, annealing the formed at least one second monolayer of second material under a second inert atmosphere at a second temperature between about 650° C. and about 900° C.

In another exemplary embodiment of the invention, a semiconductor device comprising: a substrate comprised of a substrate material; and a film disposed on a first surface of the substrate, where the film has a second surface that is opposite the first surface, where the film comprises a film material, where there is intermixing of the substrate material with the film material through a depth of said film and where there is a non-zero amount of the substrate material at the second surface.

BRIEF DESCRIPTION OF THE SEVERAL VIEWS OF THE DRAWINGS

The foregoing and other aspects of embodiments of this invention are made more evident in the following Detailed Description, when read in conjunction with the attached Drawing Figures, wherein.

DETAILED DESCRIPTION

Figure 1:
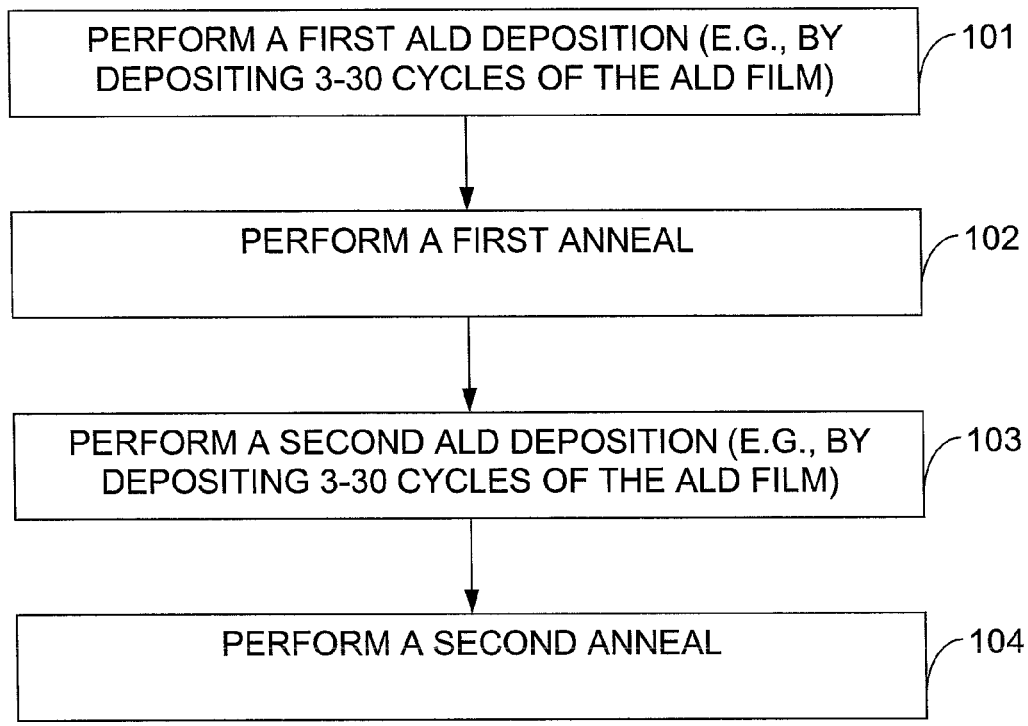
FIG. 1 depicts a flowchart illustrating one non-limiting example of a method for practicing the exemplary embodiments of this invention.

ALD and CVD processes may be used for depositing high-K dielectric films. As compared to ALD, CVD processes are generally lower cost predominantly due to greater throughput. In contrast, ALD processes are generally considered superior because of lower impurity content, better conformality and better uniformity of the films. For ALD processes, two main precursor classes are generally considered for use: Hf amides and Hf chloride. Hf chloride is advantageous because it does not contain C, and therefore has no C in the film. However, Hf chloride has several disadvantages. Hf chloride is a solid and, therefore, is more difficult to deliver in the gas phase and is more difficult to deliver in a repeatable manner. Hf chloride cannot easily be dissolved in a volatile solvent for use in a liquid delivery system. Furthermore, the process using HfCl4 with water as the oxidant produces HCl that is corrosive and can damage vacuum systems and deposition chamber parts.

In view of the above, Hf amides have various advantages over HfCl4, but, because of C contamination in the films, they have traditionally shown inferior electrical performance when compared with HfCl4 based films. In the case of CVD films, it is possible to reduce in-film C contamination by increasing the deposition temperature. However, in the case of ALD there is an upper temperature limit for a given precursor that cannot be exceeded without producing parasitic CVD processes during the deposition and thus making the film non-uniform.

For Hf oxide ALD, it is generally preferred to use water as the oxidant because it provides good growth characteristics without interface re-growth. If ozone were used it would be possible to produce films low in C by increasing the ozone exposure. However, in that case the interface becomes thick and even may be too thick to be useful as a gate dielectric.

As a non-limiting example, an ALD process may deposit conformal layers of material by repeating the following four steps: (1) expose the substrate to the first precursor; (2) purge or evacuate the reaction chamber to remove by-products and any non-reacted first precursor; (3) expose the substrate to the second precursor (or use a treatment to activate the surface for a reaction of the first precursor); and (4) purge or evacuate the chamber to remove by-products and any non-reacted second precursor. Each reaction cycle deposits an amount of material on the surface, referred to as the growth per cycle. The reaction cycles are repeated to achieve a desired thickness. An individual cycle may typically deposit less than a monolayer of film.

In accordance with the exemplary embodiments of the invention, a plurality of cycles are deposited via ALD before performing an anneal. This is in contrast to conventional techniques where an anneal is performed after each deposition cycle. By depositing multiple cycles prior to the anneal, improved properties can be realized or obtained, such as a reduction in the quantity or concentration of impurities (e.g., C), for example. Furthermore, it may also be possible to realize increased throughput and/or shorter process duration (e.g., since a fewer number of anneals are performed for a same number of cycles as compared to performing an anneal after each cycle).

Exemplary embodiments of the invention use ALD to deposit a dielectric film with excellent thickness control, uniformity and conformality. The film is deposited in a multistep process with in-situ anneals that reduces impurities (e.g., C) in the film and causes the film to densify versus an unannealed film. In addition, the interface layer structure is altered by the deposition-annealing process. A result of the changes is a reduction in or elimination of trap assisted tunneling when the film is integrated into a metal-oxide semiconductor field effect transistor (MOSFET) device, and, thus, a reduction in gate leakage current.

In some exemplary embodiments, the anneal is performed under a first inert atmosphere (e.g., using an inert gas) at a first temperature between about 650° C. and about 900° C. In some exemplary embodiments, the combination of annealing with a temperature range of about 650° C. to about 900° C. and performing the anneal under an inert atmosphere constitute an novel, exemplary arrangement. As a non-limiting example, electrical properties may be seen to improve with increasing anneal temperatures as one approaches about 900° C. At, around or above 900° C. deterioration may be observed (e.g., degradation of a high-k/SiO interface, lowering mobility), leading to a reduction in desirable electrical properties (e.g., due to increased film roughening).

The number of cycles deposited before annealing or the number of cycles deposited between anneals may be measured, as non-limiting examples, according to a number of cycles, a thickness or a number of monolayers formed by the deposition. As utilized herein, a monolayer is defined as a single layer of complete coverage on a given surface for a given material. For example, if the material in question were HfO2 then a monolayer would comprise a thickness of HfO2 required to completely cover the given surface. Since each cycle of deposition for ALD results in less than one monolayer, a plurality of cycles (e.g., at least two cycles) is needed to form a single monolayer. Additional cycles beyond the number needed to form a single monolayer may result in the formation of a plurality of monolayers. Generally, and as non-limiting examples, each monolayer may have a thickness of about 3-5 Å (i.e., about 3 Å to about 5 Å). It should be noted that the precursor used can change or affect the number of cycles deposited (e.g., the number of cycles deposited to meet a certain condition or amount).

It should be understood that references herein to cycles, monolayers and thicknesses (e.g., for ALD-deposited materials) are not exclusive. At least in some cases, these three terms may be interrelated since they can be used to express, discuss or quantify an amount of deposited material (e.g., as deposited via ALD). As noted above, each cycle of ALD may deposit 0.2-1.5 Å of film. Also as noted above, each monolayer may have a thickness of about 3-5 Å. Thus, one monolayer may be achieved (i.e., formed, realized, created) by performing 2-25 cycles of ALD. Furthermore, forming at least one monolayer will thus result in the formation of a layer having a thickness of at least 3-5 Å (e.g., a layer with a thickness greater than or equal to about 3 Å).

In some exemplary embodiments, a minimum number of cycles deposited before annealing or between anneals comprises enough cycles to form at least one monolayer of coverage. In further exemplary embodiments, a minimum number of cycles deposited before annealing or between anneals comprises enough cycles to form at least n monolayers of coverage, where n is an integer and $1 \leq n \leq 10$. In some exemplary embodiments, a minimum number of cycles deposited before annealing or between anneals comprises enough cycles to form (a layer with) a thickness of about 3-50 Å (i.e., about 3 Å to about 50 Å). In further exemplary embodiments, a maximum number of cycles deposited before annealing or between anneals comprises about 2-30 cycles (i.e., about 2 cycles to about 30 cycles) or about 1-10 monolayers (i.e., 1 monolayer to about 10 monolayers). In some exemplary embodiments, a minimum or a maximum number of cycles deposited before annealing or between anneals depends on a film underneath (e.g., underlying, below) the layer(s) being deposited. It may be preferable to deposit 5-20 cycles (e.g., at least 5 cycles, no more than about 20 cycles) of the ALD film before or between anneals.

In one exemplary embodiment, an ALD process is performed using a Hf amide and water between about 250° C. and 400° C. substrate temperature (e.g., at about 300° C.), where the Hf amide is of the form $Hf[N(R1)(R2)]xL(4-x)$, where R1 and R2 are each individually selected from C1-6 alkyl groups, L is a mono-anionic ligand (e.g., cyclopentadienyl or a substituted cyclopentadienyl), and x is an integer from 1-4 (i.e., $1 \leq x \leq 4$).

In another exemplary embodiment, and as shown in FIG. 1, an ALD process is performed as follows. Perform a first deposition by depositing 3-30 cycles of the ALD film (step 101). Perform a first anneal (step 102). Perform a second deposition by depositing 3-30 cycles of ALD film (step 103). Perform a second anneal (step 104).

As an example, the first anneal and/or the second anneal may be performed under an inert gas for 5-50 seconds at a pressure less than 30 Torr and a temperature of 650-900° C. (e.g., about, approximately, substantially, in the range of). As an example, the first deposition and/or the second deposition may deposit 5-20 cycles of the ALD film. In some exemplary embodiments, the process is performed without exposing the substrate to air between the steps. As non-limiting examples, the inert gas may comprise N, He, Ar, Kr and/or Ne.

The process may be for deposition of a material, such as a high-k dielectric, for example. The first deposition may comprise 5-15 cycles. The second deposition may comprise 5-15 cycles. The first anneal may be performed at 650-900° C. The second anneal may be performed at 650-900° C. The depositions and anneals may be performed in situ with minimal or no air exposure. The deposited material may comprise a (high-k) dielectric having a dielectric constant greater than 3.9. The ALD film may comprise at least one of Hf and Zr, as non-limiting examples.

The resulting (high-k) dielectric film may have a lower carbon level than an un-annealed (high-k) dielectric film deposited by ALD. The process may be performed using at least one of a metal organic Hf precursor (e.g., Hf amide), water as the oxidant and ozone as the oxidant. The resulting (high-k) dielectric may have an interfacial layer or region of intermixed (high-k) material (e.g., Hf) and underlying semiconductor material (e.g., Si). Further non-limiting examples of suitable Hf precursors include: $Hf(O^tBu)_4$ (hafnium tert-butoxide, HTB), $Hf(NEt_2)_4$ (tetrakis(diethylamido)hafnium, TDEAH), $Hf(NEtMe)_4$ (tetrakis(ethylmethylamido) hafnium, TEMAH), $Hf(NMe_2)_4$ (tetrakis(dimethylamido) hafnium, TDMAH), $Hf(mmp)_4$ (hafnium methymethoxypropionate, Hf mmp), $HfCl_4$, (tetrakis(N,N'-dimethylacetamidinato)), Hf, $Cp_2HfMe_2$, $Cp_2Hf(Me)OMe$, $(tBuCp)_2HfMe_2$, $CpHf(NMe_2)_3$, and $Hf(N^iPr_2)_4$. Note that: Cp stands for cyclopentadienyl or alkylcyclopentadienyl; Me stands for methyl; Et stands for ethyl; and $^iPr$ stands for iso-propyl.

The process may comprise deposition of a threshold voltage adjustment layer after at least one of step 101, step 102 and step 103. The process may comprise repeating steps 101 and 102 a number of times (e.g., repeatedly, a plurality of times, a plurality of instances) prior to step 103. The process may comprise repeating steps 103 and 104 (e.g., repeatedly, a plurality of times, a plurality of instances). The process may comprise repeating steps 103 and 104 (e.g., repeatedly, a plurality of times, a plurality of instances) after performing steps 101 and 102. The (high-k) deposition may be performed on at least one of a chemical oxide and an oxynitride (starting) surface.

Steps 101 and 102 may be performed in a same chamber. Steps 103 and 104 may be performed in a same chamber. Steps 101, 102, 103 and 104 may be performed in a same chamber. Steps 101 and 102 may be performed in different chambers. Steps 103 and 104 may be performed in different chambers. Steps 101, 102, 103 and 104 may be performed in different chambers. The process may be used to form and/or form a component of at least one of a semiconductor device, a FET, a MOSFET, a MOS capacitor, a memory, a memory device and/or a memory capacitor. A semiconductor device formed using the process may be planar and/or non-planar. A semiconductor device formed using the process may be formed using gate-first integration and/or gate-last integration. A system configured to perform the process may include a transfer module (e.g., with a load lock), at least one ALD deposition chamber and/or at least one anneal chamber. A system configured to perform the process may include at least two deposition chambers and/or at least two anneal chambers. A system configured to perform the process may include a transfer module (e.g., with a load lock) and/or a chamber capable of performing both the (high-k) deposition and the anneal.

Exemplary embodiments of the invention allow for formation of a gate dielectric with desirable uniformity on planar structures, and further allow for formation of a gate dielectric with desirable uniformity and conformality when used in a non-planar field-effect transistor (FET), such as a FinFET or tri-gate FET, or when used in a replacement gate integration scheme. Furthermore, as noted above exemplary embodiments allow for formation of a gate dielectric with improved electrical properties including reduced leakage (e.g., from trap assisted tunneling). In addition, exemplary embodiments of the invention enable sufficient throughput to be productive in a semiconductor fabrication line while maintaining the desirable uniformity and conformality of the ALD process. Furthermore, exemplary embodiments of the invention enable improved scaling and/or lower leakage without compromising long channel mobility and/or threshold voltage.

Figure 2:
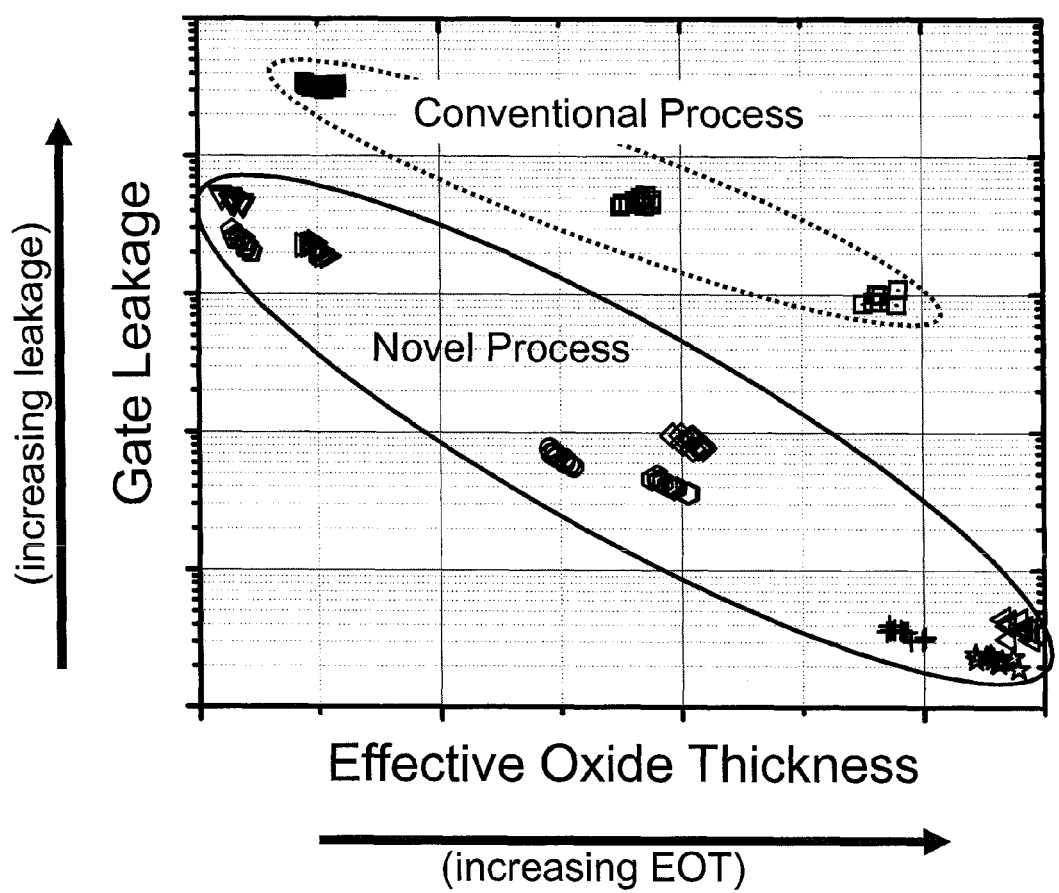
FIG. 2 is a graph showing gate leakage versus effective oxide thickness for both a novel process and a conventional process.

FIG. 2 is a graph showing gate leakage versus effective oxide thickness for both the novel process described above and a conventional process. As can be seen, the novel process yields reduced gate leakage for a given oxide thickness as compared with the conventional process.

Figure 7:
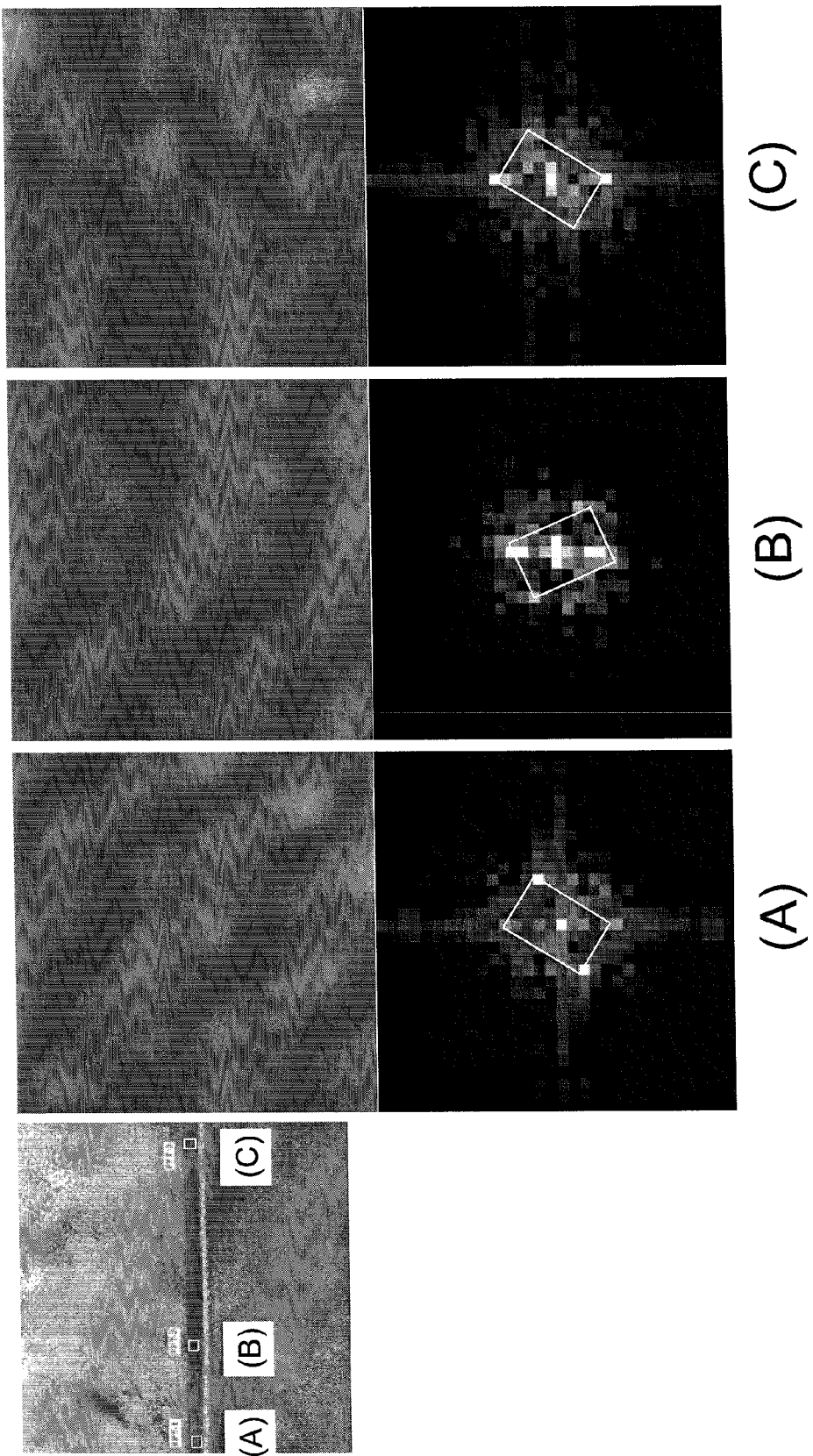
FIG. 7 shows a transmission electron microscope (TEM) image of a semiconductor film formed in accordance with the exemplary embodiments of the invention.

FIG. 7 shows a transmission electron microscope (TEM) image of a semiconductor film formed in accordance with the exemplary embodiments of the invention. Three regions of interest are identified as (A), (B) and (C). The respective images of 7(A), 7(B) and 7(C) show close-ups of these regions (top) with a Fast Fourier Transformation (FFT) of the respective close-ups (bottom). As noted by the boxes in the FFTs, the symmetry of the diffraction pattern is near tetragonal. The tetragonal arrangement corresponds to a higher (e.g., the highest) dielectric constant.

Figure 8:
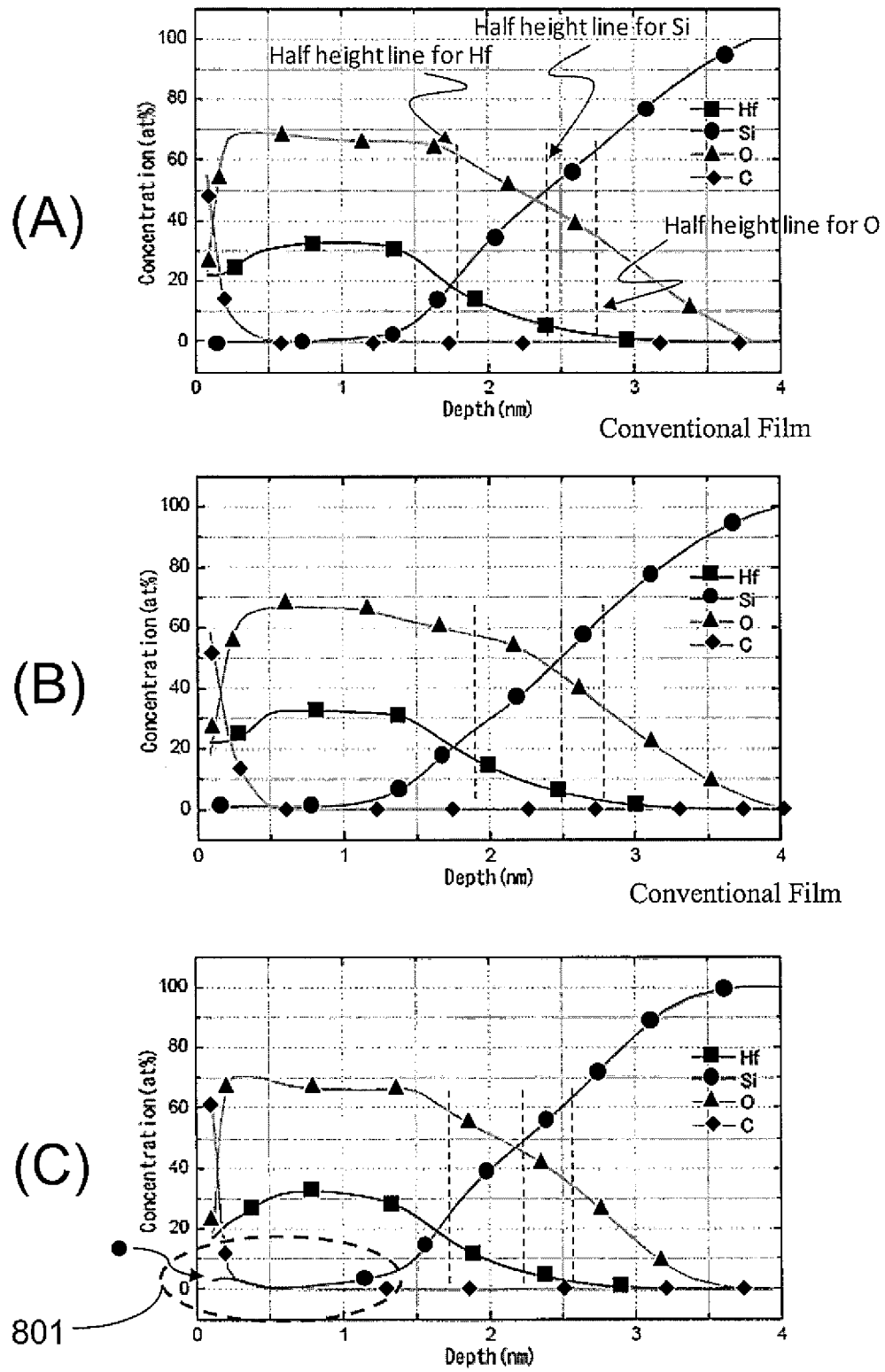
FIG. 8 shows depth profiles for various semiconductor films, including two conventional films (A and B) and one exemplary film formed in accordance with the exemplary embodiments of the invention (C)

FIG. 8 shows depth profiles for various semiconductor films, including two conventional films (A and B) and one exemplary film formed in accordance with the exemplary embodiments of the invention (C). Note that the symbols shown in the graphs (i.e., the squares, circles, triangles and diamonds) are line indicia and do not correspond to actual data points. A depth of 0 nm corresponds to the surface of the film in question.

FIG. 8A shows a depth profile for a conventional semiconductor film comprised of Hf deposited over Si, with a Hf concentration of $4.8 \times 10^{15}$ atoms/cm$^2$. No anneal has been performed—FIG. 8A shows data for the film as deposited.

FIG. 8B shows a depth profile for a conventional semiconductor film comprised of Hf deposited over Si, with a Hf concentration of $4.8 \times 10^{15}$ atoms/cm$^2$. In FIG. 8B, a post-deposition anneal has been performed.

FIG. 8C shows a depth profile for an exemplary film formed in accordance with the exemplary embodiments of the invention. The exemplary film is comprised of Hf deposited over Si, with a Hf concentration of $4.3 \times 10^{15}$ atoms/cm$^2$.

In FIGS. 8A and 8B, note that the Si is only found after or shortly before reaching a depth of about 1 nm. That is, a region of intermixed Hf and Si is only found beginning at a depth of about 1 nm. In contrast, region 801 in FIG. 8C shows that in the exemplary film there is increased intermixing of the dielectric (e.g., a high-k dielectric, Hf) and the underlying semiconductor material (e.g., the substrate, Si). In some exemplary embodiments, this intermixing is such that the intermixed region begins at the surface of the exemplary film.

As an alternative description to the above, in the conventional devices there is a zero amount or concentration of Si at the surface (i.e., a depth of 0 nm), can be seen in FIGS. 8A and 8B. In contrast, the exemplary film of FIG. 8C has a non-zero amount or concentration of substrate material (e.g., Si) at the surface of the film (i.e., a depth of 0 nm).

Figure 9:
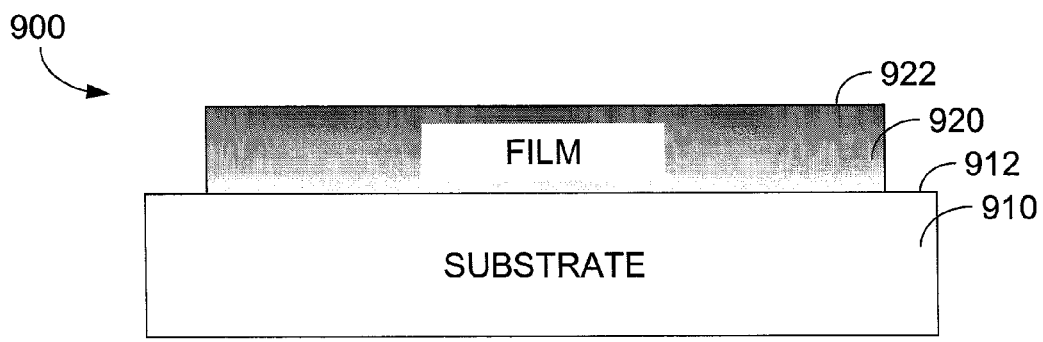
FIG. 9 shows an exemplary semiconductor device formed in accordance with the exemplary embodiments of the invention.

FIG. 9 shows an exemplary semiconductor device 900 formed in accordance with the exemplary embodiments of the invention, as described above. The exemplary semiconductor device 900 includes a substrate 910 and a film 920 deposited on (e.g., disposed on, abutting, adjacent to, overlying, disposed over) a first surface 912 of the substrate 910. The film 920 has a second surface 922 opposite the first surface 912 of the substrate 910. The substrate 910 comprises a substrate material (e.g., a semiconductor, Si, undoped Si). The film 920 comprises a film material (e.g., a dielectric, a high-k dielectric, HfO2). There is a non-zero amount or concentration of the substrate material at the second surface 922 of the film 920. In at least some exemplary embodiments of the invention, there is intermixing of the substrate material with the film material through a depth of the film 920 (e.g., from the second surface towards the first surface, depth as measured from the second surface towards the first surface, the intermixing increasing from the second surface towards the first surface—along at least a portion of the depth, the intermixing decreasing from the first surface towards the second surface—along at least a portion of the depth).

Note that in some exemplary embodiments of the invention, there is a concentration gradient of substrate semiconductor material through a depth of the film 920 (e.g., from the second surface towards the first surface, depth as measured from the second surface towards the first surface, the gradient increasing from the second surface towards the first surface—along at least a portion of the depth, the gradient decreasing from the first surface towards the second surface—along at least a portion of the depth).

In some exemplary embodiments, the substrate 910 comprises bulk semiconductor substrate, a silicon-on-insulator substrate or a semiconductor-on-insulator. In further exemplary embodiments, a concentration of the substrate semiconductor material at the second surface of the film is: less than 100%; less than about 50%; less than about 10%; and/or less than about 5%.

In some exemplary embodiments, the substrate may have an oxide or oxynitride film disposed (e.g., deposited, formed) on it prior to the deposition of the high-k film(s). This creates an interface layer (e.g., an oxidized interface layer, an interfacial layer) between the high-k film and the substrate. As a non-limiting example, this interface layer may be on the order of about 1 nm thick. In some exemplary embodiments, the substrate material that is found at the second surface may be in an oxidized form as opposed to the element Si.

It should be noted that all references herein to a "substrate" should be understood to correspond to any suitable substrate form or arrangement, including, but not limited to: semiconductor, bulk substrate, bulk semiconductor substrate, silicon-on-insulator, semiconductor-on-insulator and substrate that comprises one or more further layers or films (e.g., an insulating layer disposed on semiconductor). As non-limiting examples, substrate may refer to both a substrate consisting of semiconductor material and a substrate comprising an insulating layer (e.g., oxide film, oxynitride film) overlying semiconductor material.

Figure 10:
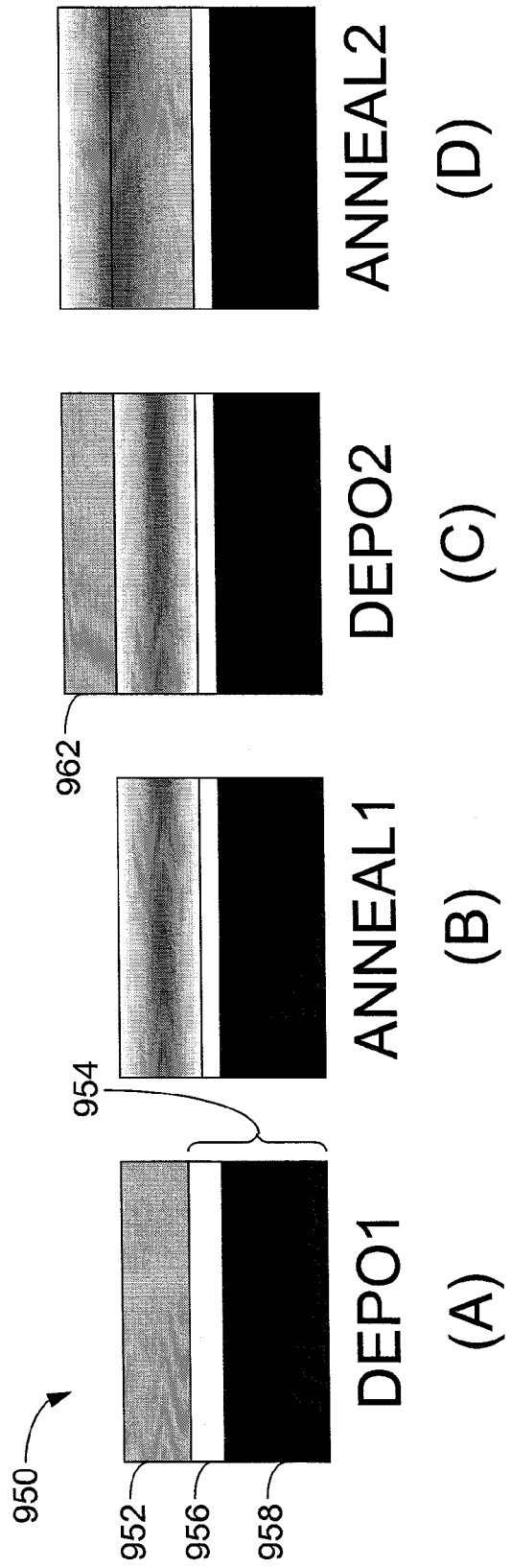
FIG. 10 shows the formation of an exemplary semiconductor device at the various steps in the performance of one exemplary method in accordance with the exemplary embodiments of the invention.

FIG. 10 shows the formation of an exemplary semiconductor device 950 at the various steps in the performance of one exemplary method in accordance with the exemplary embodiments of the invention. In FIG. 10A, a first deposition (DEPO1) is performed to deposit a first film 952 (e.g., HfO2) on a substrate 954 via ALD. The first film 952 comprises a dielectric material. The substrate 954 comprises an insulating layer 956 (e.g., oxide, oxynitride) overlying semiconductor material 958. The insulating layer 956 comprises an insulating material (e.g., SiO, SiO2). The first deposition may comprise performing a plurality of cycles of ALD and/or depositing at least one monolayer of dielectric material. In FIG. 10B, a first anneal (ANNEAL1) is performed to anneal the resulting structure. In further exemplary embodiments, as seen in FIG. 10B and as a result of the first anneal, an amount of the semiconductor material diffuses through the first film 952 and, thus, a non-zero amount of the substrate material (e.g., semiconductor material) may be located at the top of the first film 952. The semiconductor material that is located at the top of 952 may be in its insulating form.

Subsequently, and as shown in FIG. 10C, a second deposition (DEPO2) is performed to deposit a second film 962 on the structure resulting from the first anneal (i.e., the structure of FIG. 10B). The second film 962 comprises a second dielectric material (e.g., HfO2). The second deposition may comprise performing a plurality of cycles of ALD and/or depositing at least one monolayer of dielectric material. In FIG. 10D, a second anneal (ANNEAL2) is performed to anneal the resulting structure. In further exemplary embodiments, and as a result of the second anneal, an amount of the semiconductor material diffuses through the second film 962 and, thus, a non-zero amount of the semiconductor material may be located at the top of the second film 962. The semiconductor material that is located at the top of 952 may be in its insulating faun.

It should be noted that the components, steps and procedures illustrated in FIG. 10 are exemplary. In further exemplary embodiments of the invention, the end result may be achieved using other methods, techniques, procedures, materials and arrangements, including those further exemplary aspects and exemplary techniques disclosed herein.

As compared to prior art structures (i.e., structures formed in accordance with prior art techniques), novel structures produced in accordance with the exemplary embodiments of the invention can provide a number of improvements, benefits and/or advantages. Below are identified various non-limiting examples of characteristics and/or advantages that may be provided by one or more of the exemplary structures and techniques described herein.

Carbon levels in exemplary novel structures are 3-4 times lower. The exemplary novel structures (e.g., HfO2) are thinner than conventional structures without anneal at a same number of cycles. As an example, the thinner HfO2 may be due to densification (e.g., possibly due to the tetragonal-like symmetry). A SiO:Si substrate peak ratio for the exemplary novel structures is increased (e.g., the SiO intermixing with HfO). Film roughening is minimized by using the exemplary novel techniques (e.g., as compared with a single post-deposition anneal).

Below are further descriptions of various non-limiting, exemplary embodiments of the invention. The below-described exemplary embodiments are numbered separately for clarity purposes. This numbering should not be construed as entirely separating the various exemplary embodiments since aspects of one or more exemplary embodiments may be practiced in conjunction with one or more other aspects or exemplary embodiments.

Figure 3:
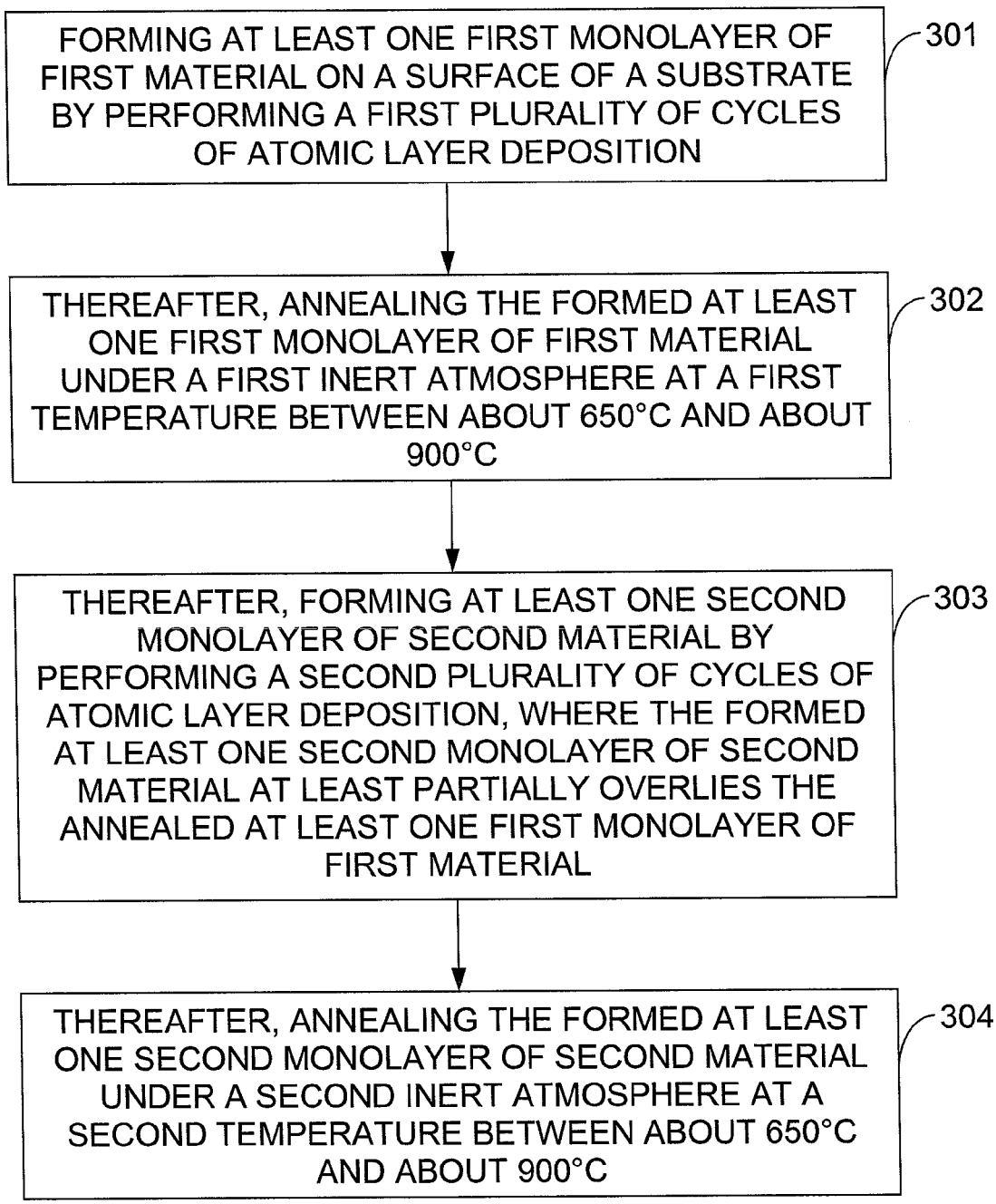
FIG. 3 depicts a flowchart illustrating another non-limiting example of a method for practicing the exemplary embodiments of this invention.

(1) In a further exemplary embodiment, and as shown in FIG. 3, a method comprising: forming at least one first monolayer of first material on a surface of a substrate by performing a first plurality of cycles of atomic layer deposition (301); thereafter, annealing the formed at least one first monolayer of first material under a first inert atmosphere at a first temperature between about 650° C. and about 900° C. (302); thereafter, forming at least one second monolayer of second material by performing a second plurality of cycles of atomic layer deposition, where the formed at least one second monolayer of second material at least partially overlies the annealed at least one first monolayer of first material (303); and thereafter, annealing the formed at least one second monolayer of second material under a second inert atmosphere at a second temperature between about 650° C. and about 900° C. (304).

A method as above, where a monolayer is defined as a single layer of complete coverage on a given surface for the material. A method as in any above, where at least one of the first inert atmosphere and the second inert atmosphere comprises at least one of Nitrogen, Helium, Argon, Krypton and Neon. A method as in any above, where at least one of the first material and the second material comprises a dielectric with a dielectric constant greater than 3.9. A method as in any above, where at least one of the first material and the second material comprises at least one of Hafnium and Zirconium. A method as in any above, where the formed at least one first monolayer of the first material comprises a maximum of ten first monolayers of the first material. A method as in any above, where the formed at least one second monolayer of the second material comprises a maximum of ten second monolayers of the second material.

A method as in any above, where the first material comprises the second material. A method as in any above, where the first temperature comprises the second temperature. A method as in any above, where the first inert atmosphere comprises the second inert atmosphere. A method as in any above, where the first material is different from the second material. A method as in any above, where the first temperature is different from the second temperature. A method as in any above, where the first inert atmosphere is different from the second inert atmosphere.

An apparatus (e.g., a device, a semiconductor device) comprising a dielectric film formed according to any one of the above methods. An apparatus (e.g., a device, a semiconductor device) comprising a dielectric film formed according to any one of the above methods, where at least one first monolayer of the first material comprises Hafnium and Silicon, where the dielectric film comprises tetragonal hafnia (e.g., tetragonal symmetry). An apparatus as in any above, where the apparatus comprises a field effect transistor. An apparatus as in any above, where the apparatus comprises a capacitor. An apparatus as in any above, where the apparatus comprises a memory. An apparatus as in any above, where the apparatus comprises a memory cell. An apparatus as in any above, where the apparatus comprises a flash memory cell. An apparatus as in any above, where the apparatus comprises at least one of a transistor, a field effect transistor, a capacitor, a memory, a memory cell, a flash memory cell and a semiconductor device.

A method as in any above, further comprising one or more aspects of the exemplary embodiments of the invention as described herein. A semiconductor structure formed in accordance with any of the above methods (i.e., one or more of the above-described methods).

Figure 4:
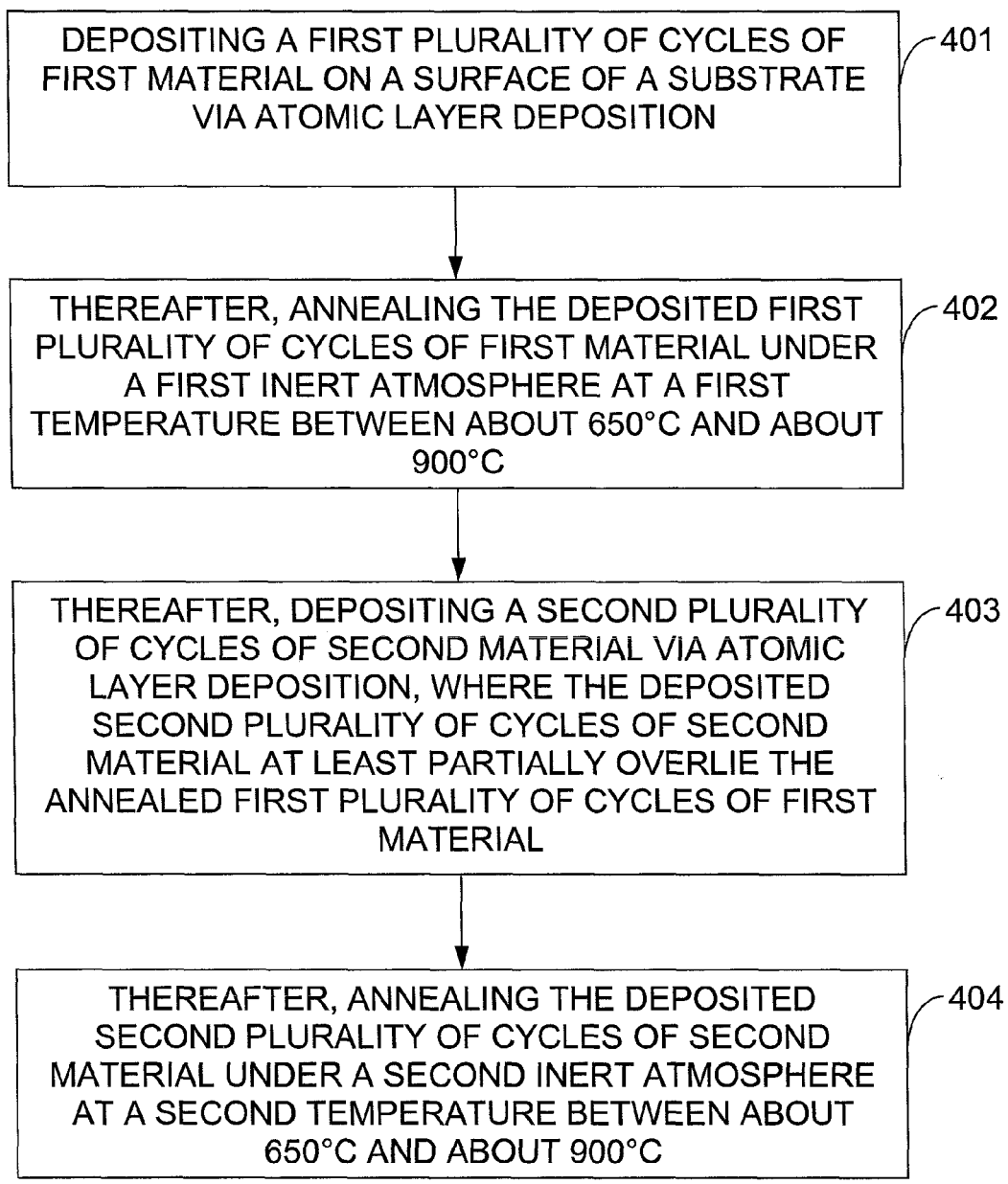
FIG. 4 depicts a flowchart illustrating another non-limiting example of a method for practicing the exemplary embodiments of this invention.

(2) In a further exemplary embodiment, and as shown in FIG. 4, a method comprising: depositing a first plurality of cycles of first material on a surface of a substrate via atomic layer deposition (401); thereafter, annealing the deposited first plurality of cycles of first material under a first inert atmosphere at a first temperature between about 650° C. and about 900° C. (402); thereafter, depositing a second plurality of cycles of second material via atomic layer deposition, where the deposited second plurality of cycles of second material at least partially overlie the annealed first plurality of cycles of first material (403); and thereafter, annealing the deposited second plurality of cycles of second material under a second inert atmosphere at a second temperature between about 650° C. and about 900° C. (404).

A method as in any above, where the deposited first plurality of cycles of the first material comprise a maximum of thirty cycles of the first material. A method as in any above, where the deposited second plurality of cycles of the second material comprise a maximum of thirty cycles of the second material. A method as in any above, further comprising one or more aspects of the exemplary embodiments of the invention as described herein. A semiconductor structure formed in accordance with any of the above methods (i.e., one or more of the above-described methods).

Figure 5:
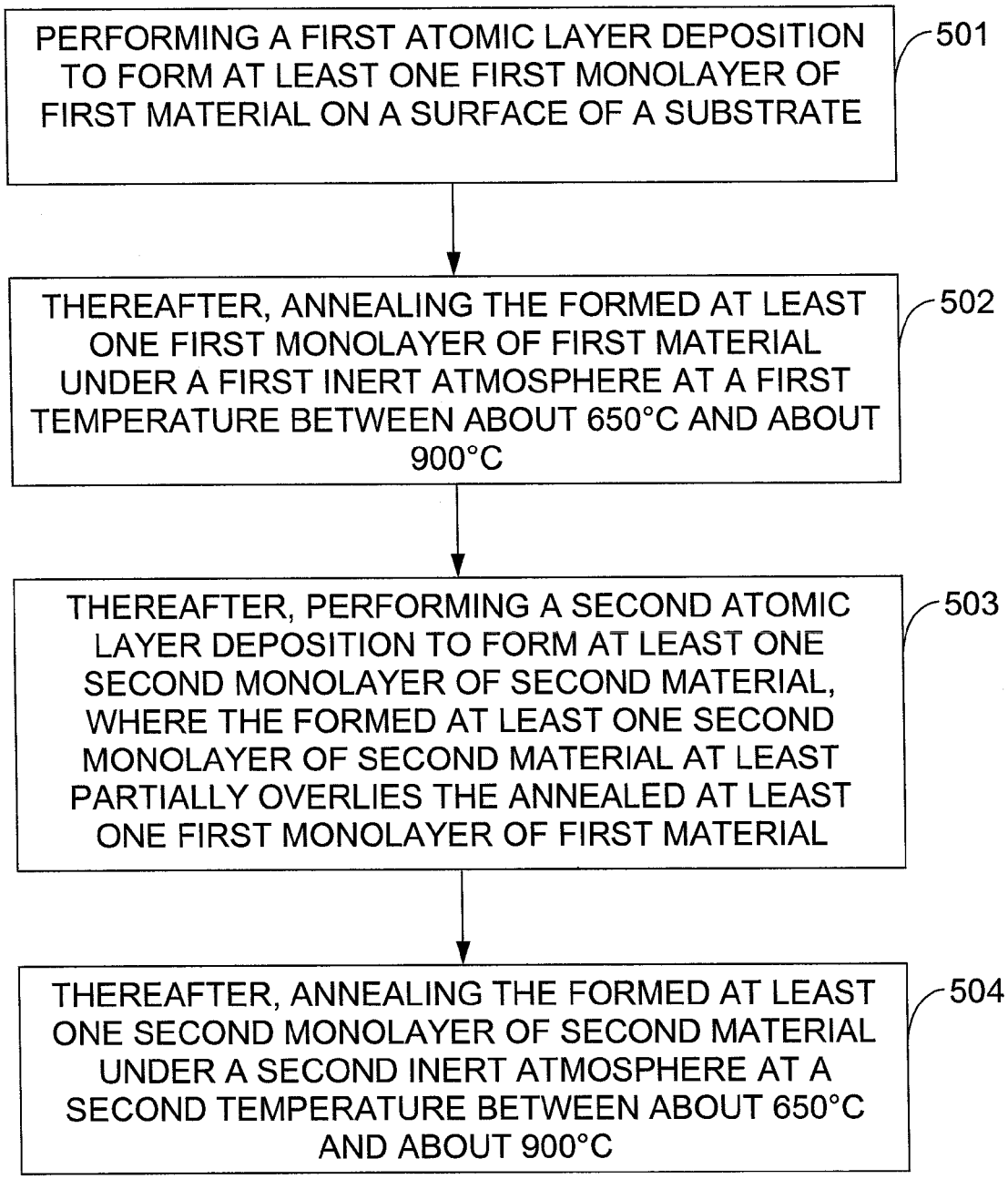
FIG. 5 depicts a flowchart illustrating another non-limiting example of a method for practicing the exemplary embodiments of this invention.

(3) In a further exemplary embodiment, and as shown in FIG. 5, a method comprising: performing a first atomic layer deposition to form at least one first monolayer of first material on a surface of a substrate (501); thereafter, annealing the formed at least one first monolayer of first material under a first inert atmosphere at a first temperature between about 650° C. and about 900° C. (502); thereafter, performing a second atomic layer deposition to form at least one second monolayer of second material, where the formed at least one second monolayer of second material at least partially overlies the annealed at least one first monolayer of first material (503); and thereafter, annealing the formed at least one second monolayer of second material under a second inert atmosphere at a second temperature between about 650° C. and about 900° C. (504).

A method as in any above, where the formed at least one first monolayer of the first material comprises a maximum of ten first monolayers of the first material. A method as in any above, where the formed at least one second monolayer of the second material comprises a maximum of ten second monolayers of the second material. A method as in any above, further comprising one or more aspects of the exemplary embodiments of the invention as described herein. A semiconductor structure formed in accordance with any of the above methods (i.e., one or more of the above-described methods).

Figure 6:
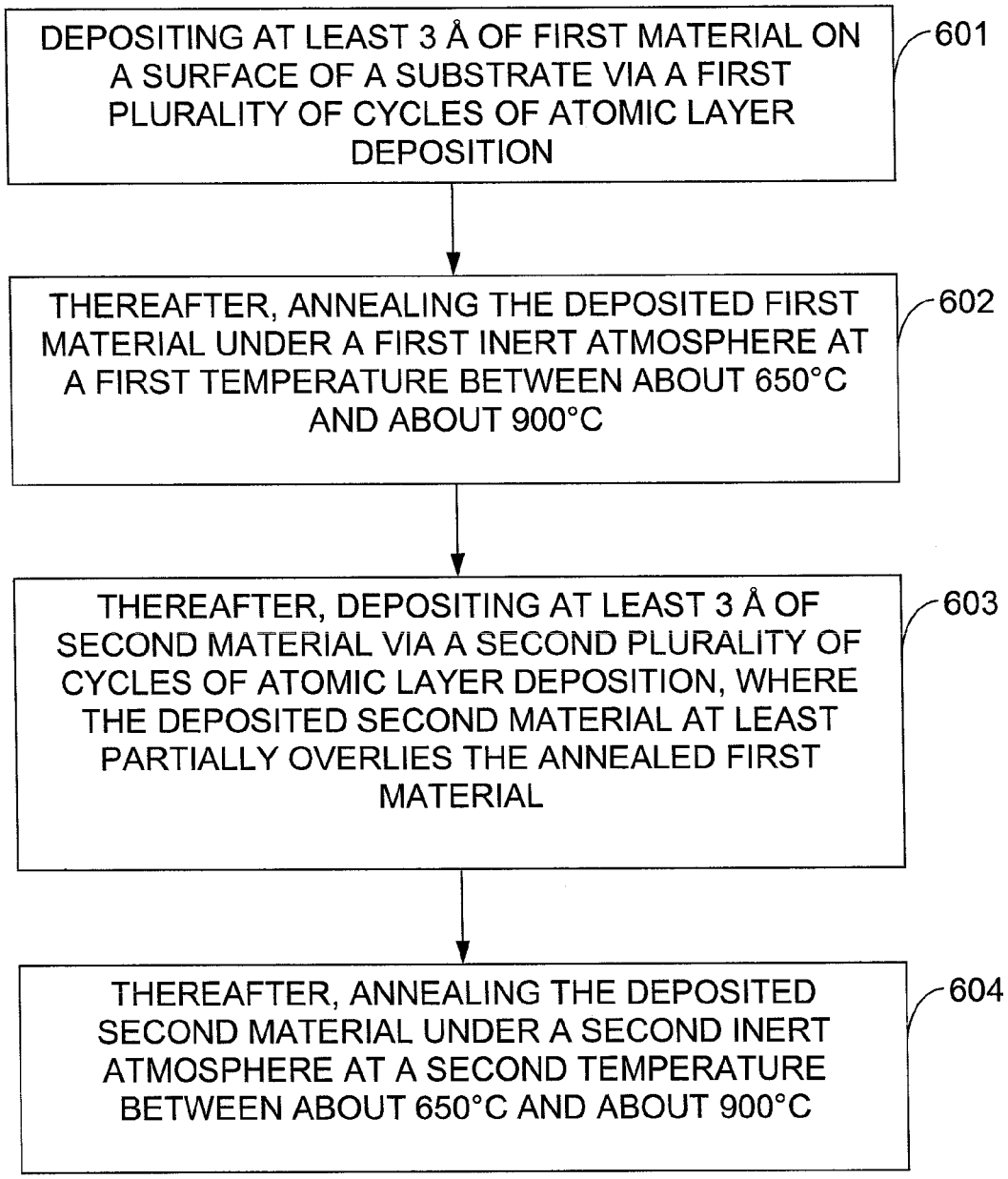
FIG. 6 depicts a flowchart illustrating another non-limiting example of a method for practicing the exemplary embodiments of this invention.

(4) In a further exemplary embodiment, and as shown in FIG. 6, a method comprising: depositing at least 3 Å of first material on a surface of a substrate via a first plurality of cycles of atomic layer deposition (601); thereafter, annealing the deposited first material under a first inert atmosphere at a first temperature between about 650° C. and about 900° C. (602); thereafter, depositing at least 3 Å of second material via a second plurality of cycles of atomic layer deposition, where the deposited second material at least partially overlies the annealed first material (603); and thereafter, annealing the deposited second material under a second inert atmosphere at a second temperature between about 650° C. and about 900° C. (604).

A method as in any above, where the deposited first material comprises a maximum thickness of 50 Å of the first material. A method as in any above, where the deposited second material comprises a maximum thickness of 50 Å of the second material. A method as in any above, further comprising one or more aspects of the exemplary embodiments of the invention as described herein. A semiconductor structure formed in accordance with any of the above methods (i.e., one or more of the above-described methods).

(5) In a further exemplary embodiment, and as shown in FIG. 9, a semiconductor device (900) comprising: a substrate (910) comprised of a substrate material; and a film (920) disposed on a first surface (912) of the substrate, where the film (920) has a second surface (922) that is opposite the first surface (912), where the film (920) comprises a film material, where there is intermixing of the substrate material with the film material through a depth of said film (920) and where there is a non-zero amount of the substrate material at the second surface (922).

A semiconductor device as above, where at the second surface a concentration of the substrate semiconductor material is less than 100%. A semiconductor device as in any above, where at the second surface a concentration of the substrate semiconductor material is less than about 50%. A semiconductor device as in any above, where at the second surface a concentration of the substrate semiconductor material is less than about 10%. A semiconductor device as in any above, where the substrate semiconductor material comprises Silicon and the dielectric material comprises Hafnium.

A semiconductor device as in any above, where the film material comprises Hafnium. A semiconductor device as in any above, where the substrate material comprises Silicon. A semiconductor device as in any above, where the substrate material comprises SiO or SiO2. A semiconductor device as in any above, where the substrate material comprises (or further comprises) an insulating layer (e.g., an oxide, an oxynitride, SiO, SiO2). A semiconductor device as in any above, where the film material comprises a dielectric material. A semiconductor device as in any above, where the film material comprises a high-k dielectric material. A semiconductor device as in any above, where the substrate material comprises a semiconductor material.

A semiconductor device as in any above, where the non-zero amount of the substrate material at the second surface is non-conducting. A semiconductor device as in any above, where the non-zero amount of the substrate material at the second surface is a dielectric or is in a dielectric form. A semiconductor device as in any above, further comprising a metal layer disposed on the second surface. A semiconductor device as in any above, where the semiconductor device comprises a capacitor, a FET or a MOSFET.

A semiconductor device as in any above, where the film is deposited on the first surface of the substrate via atomic layer deposition. A semiconductor device as in any above, where the film is deposited on the first surface of the substrate via atomic layer deposition in accordance with any (e.g., any one) of the exemplary methods described herein. A semiconductor device as in any above, where the semiconductor device comprises at least one of a FET, a MOSFET, a MOS capacitor, a memory, a memory device and a memory capacitor. A semiconductor device as in any above, further comprising one or more aspects of the exemplary embodiments of the invention as described herein.

The blocks shown in FIGS. 1 and 3-6 further may be considered to correspond to one or more functions and/or operations that are performed by one or more components, circuits, chips, apparatus, processors, computer programs and/or function blocks. Any and/or all of the above may be implemented in any practicable solution or arrangement that enables operation in accordance with the exemplary embodiments of the invention as described herein.

In addition, the arrangement of the blocks depicted in FIGS. 1 and 3-6 should be considered merely exemplary and non-limiting. It should be appreciated that the blocks shown in FIGS. 1 and 3-6 may correspond to one or more functions and/or operations that may be performed in any order (e.g., any suitable, practicable and/or feasible order) and/or concurrently (e.g., as suitable, practicable and/or feasible) so as to implement one or more of the exemplary embodiments of the invention. In addition, one or more additional functions, operations and/or steps may be utilized in conjunction with those shown in FIGS. 1 and 3-6 so as to implement one or more further exemplary embodiments of the invention.

That is, the exemplary embodiments of the invention shown in FIGS. 1 and 3-6 may be utilized, implemented or practiced in conjunction with one or more further aspects in any combination (e.g., any combination that is suitable, practicable and/or feasible) and are not limited only to the steps, blocks, operations and/or functions shown in FIGS. 1 and 3-6.

The exemplary methods and techniques described herein may be used in the fabrication of integrated circuit chips. The resulting integrated circuit chips can be distributed by the fabricator in raw wafer form (i.e., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). The chip is then integrated with other chips, discrete circuit elements and/or other signal processing devices as part of either (a) an intermediate product, such as a motherboard, or (b) an end product. The end product can be any product that includes integrated circuit chips, ranging from toys and other low-end applications to advanced computer products having numerous components, such as a display, a keyboard or other input device and/or a central processor, as non-limiting examples.

The terminology used herein is for the purpose of describing particular exemplary embodiments only and is not intended to be limiting of the exemplary embodiments of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Unless described otherwise herein, "depositing" may include any now known or later developed techniques appropriate for the material to be deposited, including, but not limited to: chemical vapor deposition (CVD), low-pressure CVD (LPCVD), plasma-enhanced CVD (PECVD), semi-atmosphere CVD (SACVD), high density plasma CVD (HD-PCVD), rapid thermal CVD (RTCVD), ultra-high vacuum CVD (UHVCVD), limited reaction processing CVD (LR-PCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating or evaporation. Any references to "poly," "polysilicon" or "poly Si" should be understood to refer to polycrystalline silicon.

Any use of the terms "connected," "coupled" or variants thereof should be interpreted to indicate any such connection or coupling, direct or indirect, between the identified elements. As a non-limiting example, one or more intermediate elements may be present between the "coupled" elements. The connection or coupling between the identified elements may be, as non-limiting examples, physical, electrical, magnetic, logical or any suitable combination thereof in accordance with the described exemplary embodiments. As non-limiting examples, the connection or coupling may comprise one or more printed electrical connections, wires, cables, mediums or any suitable combination thereof.

Generally, various exemplary embodiments of the invention can be implemented in different mediums, such as software, hardware, logic, special purpose circuits or any combination thereof. As a non-limiting example, some aspects may be implemented in software which may be run on a computing device, while other aspects may be implemented in hardware.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. However, all such and similar modifications will still fall within the scope of the teachings of the exemplary embodiments of the invention.

Furthermore, some of the features of the preferred embodiments of this invention could be used to advantage without the corresponding use of other features. As such, the foregoing description should be considered as merely illustrative of the principles of the invention, and not in limitation thereof.

What is claimed is:

1. A method comprising:
    forming a film comprising at least one first monolayer of a first material on a first surface of a substrate comprised of a substrate material by performing a first plurality of cycles of atomic layer deposition, the film having a second surface that is away from and not in contact with the first surface;
    thereafter, annealing the film under a first inert atmosphere at a first temperature between about 650° C. and about 900° C. forming a concentration gradient of the substrate material in the first material where there is intermixing of the substrate material with the first material where there is a non-zero amount of the substrate material at the second surface;
    thereafter, forming at least one second monolayer of a second material by performing a second plurality of cycles of atomic layer deposition, where the formed at least one second monolayer of the second material at least partially overlies the annealed film; and
    thereafter, annealing the formed at least one second monolayer of the second material under a second inert atmosphere at a second temperature between about 650° C. and about 900° C.

2. The method of claim 1, where a monolayer is defined as a single layer of complete coverage for the material.

3. The method of claim 1, where at least one of the first inert atmosphere and the second inert atmosphere comprises at least one of Nitrogen, Helium, Argon, Krypton and Neon.

4. The method of claim 1, where at least one of the first material and the second material comprises a dielectric with a dielectric constant greater than 3.9.

5. The method of claim 1, where at least one of the first material and the second material comprises at least one of Hafnium and Zirconium.

6. The method of claim 1, where the formed at least one first monolayer of the first material comprises a maximum of ten first monolayers of the first material.

7. The method of claim 1, where the formed at least one second monolayer of the second material comprises a maximum of ten second monolayers of the second material.

8. A method comprising:
    depositing a first plurality of cycles of a first material to form a film on a first surface of a substrate comprised of a substrate material via atomic layer deposition, the film having a second surface that is away from and not in contact with the first surface;
    thereafter, annealing the film under a first inert atmosphere at a first temperature between about 650° C. and about 900° C. wherein the annealing forms a concentration gradient of the substrate material in the first material where there is intermixing of the substrate material with the first material where there is a non-zero amount of the substrate material at the second surface;
    thereafter, depositing a second plurality of cycles of a second material via atomic layer deposition, where the deposited second plurality of cycles of the second material at least partially overlie the annealed first plurality of cycles of the first material; and
    thereafter, annealing the deposited second plurality of cycles of the second material under a second inert atmosphere at a second temperature between about 650° C. and about 900° C.

9. The method of claim 8, where the deposited first plurality of cycles of the first material comprise a maximum of thirty cycles of the first material.

10. The method of claim 8, where the deposited second plurality of cycles of the second material comprise a maximum of thirty cycles of the second material.

11. The method of claim 8, where at least one of the first inert atmosphere and the second inert atmosphere comprises at least one of Nitrogen, Helium, Argon, Krypton and Neon.

12. A method comprising:
    performing a first atomic layer deposition to form a film comprising at least one first monolayer of a first material on a first surface of a substrate comprised of a substrate material, the film having a second surface that is away from and not in contact with the first surface;

thereafter, annealing the formed at least one first monolayer of the first material under a first inert atmosphere at a first temperature between about 650° C. and about 900° C. wherein the annealing forms a concentration gradient of the substrate material in the first material where there is intermixing of the substrate material with the first material where there is a non-zero amount of the substrate material at the second surface;

thereafter, performing a second atomic layer deposition to form at least one second monolayer of a second material, where the formed at least one second monolayer of the second material at least partially overlies the annealed at least one first monolayer of first material; and thereafter, annealing the formed at least one second monolayer of the second material under a second inert atmosphere at a second temperature between about 650° C. and about 900° C.

13. The method of claim 12, where a monolayer is defined as a single layer of complete coverage for the material.

14. The method of claim 12, where the formed at least one first monolayer of the first material comprises a maximum of ten first monolayers of the first material.

15. The method of claim 12, where the formed at least one second monolayer of the second material comprises a maximum of ten second monolayers of the second material.

* * * * *